United States Patent
Kehayias et al.

(10) Patent No.: US 11,796,612 B1
(45) Date of Patent: Oct. 24, 2023

(54) MICROMAGNET PUF READOUT USING A QUANTUM DIAMOND MICROSCOPE

(71) Applicant: National Technology & Engineering Solutions of Sandia, LLC, Albuquerque, NM (US)

(72) Inventors: Pauli Mark Kehayias, Albuquerque, NM (US); Ezra Bussmann, Albuquerque, NM (US); Tzu-Ming Lu, Albuquerque, NM (US); Andrew Mounce, Albuquerque, NM (US)

(73) Assignee: National Technology & Engineering Solutions of Sandia, LLC, Albuquerque, NM (US)

(*) Notice: Subject to any disclaimer, the term of this patent is extended or adjusted under 35 U.S.C. 154(b) by 7 days.

(21) Appl. No.: 17/494,056

(22) Filed: Oct. 5, 2021

Related U.S. Application Data

(60) Provisional application No. 63/090,944, filed on Oct. 13, 2020.

(51) Int. Cl.
  *G01R 33/32* (2006.01)
  *G06V 20/00* (2022.01)
  *G01R 33/035* (2006.01)
  *G06F 18/213* (2023.01)

(52) U.S. Cl.
  CPC ....... *G01R 33/326* (2013.01); *G01R 33/0354* (2013.01); *G06F 18/213* (2023.01); *G06V 20/95* (2022.01)

(58) Field of Classification Search
  CPC .. G01R 33/326; G01R 33/0354; G06V 20/95; G06F 18/213
  See application file for complete search history.

(56) References Cited

U.S. PATENT DOCUMENTS

| 4,806,740 A | 2/1989 | Gold et al. |
| 5,365,586 A | 11/1994 | Indeck et al. |
| 2021/0239779 A1* | 8/2021 | Turner ................ G01R 33/389 |

FOREIGN PATENT DOCUMENTS

WO  2017155967 A1  9/2017

OTHER PUBLICATIONS

Glenn, D. R. et al., "Micrometer-Scale Magnetic Imaging of Geological Samples Using a Quantum Diamond Microscope," Geochemistry, Geophysics, Geosystems, 2017 vol. 18, 3254.

Simpson, D. A. et al., "Magneto-Optical Imaging of Thin Magnetic Films Using Spins in Diamond," Scientific Reports, 2016, vol. 6, 22797.

Lesik, M et al., "Magnetic Measurements on Micrometer-Sized Samples Under High Pressure Using Designed NV Centers," Science, 2019, vol. 366, pp. 1359-1362.

(Continued)

*Primary Examiner* — Jay Patidar
(74) *Attorney, Agent, or Firm* — Martin I. Finston; Mark A. Dodd

(57) ABSTRACT

A physically unclonable function (PUF) and a method of reading it are provided. The PUF is constituted by a microfabricated array of randomly polarized micromagnets disposed on a substrate. The PUF can be read by creating a magnetization map of the PUF from the signal output of a quantum diamond microscope (QDM) and converting the magnetization map to a numerical sequence.

14 Claims, 10 Drawing Sheets

(56) References Cited

OTHER PUBLICATIONS

Schlussel, Y. et al., "Wide-Field Imaging of Superconductor Vortices with Electron Spins in Diamond," Physical Review Applied, 2018, vol. 10, 034032.

Tetienne, J-P. et al., "Quantum Imaging of Current Flow in Graphene," Science Advances, 2017, vol. 3, e1602429.

Le Sage, D. et al., "Optical Magnetic Imaging of Living Cells," Nature, 2013, vol. 496, 489.

Frescenko, I. et al., "Diamond Magnetic Microscopy of Malarial Hemozoin Nanocrystals," Physical Review Applied, 2019, vol. 11, 034029.

Lima, E. A. and Weis, B. P. "Obtaining Vector Magnetic Field Maps from Single-Component Measurements of Geological Samples," Journal of Geophysical Research, 2019, vol. 114, B06102.

Canny, J. "A Computational Approach to Edge Detection," IEEE Transactions on Pattern Analysis and Machine Intelligence, 1986, vol. PAMI-8, pp. 679-398.

De Groot L.V. et al., "Determining Individual Particle Magnetizations in Assemblages of Micrograins," Geophysical Research Letters, 2018, vol. 45, 2995.

Rukhin, A. et al., "Random and Pseudorandom Number Generators for Cryptographic Applications," NIST Special Publication 800-22 Revision 1a (2010).

Dreau, A. et al., "Avoiding Power Broadening in Optically Detected Magnetic Resonance of Single NV Defects tor Enhanced DC Magnetic Field Sensitivity," Physical Review B, 2011, vol. 84, 195204.

Kehayias, P. et al., "Imaging Crystal Stress in Diamond using Ensembles of Nitrogen-Vacancy Centers," Physical Review B, 2019, vol. 100, 174103.

Levine, E. V. et al., "Principles and Techniques of the Quantum Diamond Microscope," Nanophotonics, 2019, vol. 8, pp. 1945-1973.

Samid, G. et al., "The Rock of Randomness: A Physical Oracle for Securing Data of the Digital Grid," MRS Commununications, 2019, vol. 9, pp. 67-76.

Kehayias, P. et al., "A Physically Unclonable Function Using NV Diamond Magnetometry and Micromagnet Arrays," Journal of Applied Physocs, 2020, vol. 127, 203904.

Lu, T-M. et al., "Nanomagnet-Based Physically Unclonable Functions," 2018, SAND2018-10760R, Sandia National Laboratories, Albuquerque, NM.

Kehayias, P. "Magnetic Sensing Using Nitrogen-Vacancy Centers in Diamond,"2020, SAND2020-1932c, Sandia National Laboratories, Albuquerque, NM.

Kehayias, P. "A Physically Unclonable Function Using NV Diamond Magnetometry and Micromagnet Arrays," 2020, SAND2020-2160J, Sandia National Laboratories, Albuquerque, NM.

Kehayias, P. "Developing High-Resolution Magnetic Microscopy Applications Using NV Centers in Diamond," 2020, SAND2020-8353c, Sandia National Laboratories, Albuquerque, NM.

Kehayias, P. "Ongoing Widefield Magnetic Microscopy Application Using Nitrogen Vacancy Centers in Diamond," 2020, SAND2020-10109c, Sandia National Laboratories, Albuquerque, NM.

* cited by examiner

MICROMAGNET PUF READOUT USING A QUANTUM DIAMOND MICROSCOPE

CROSS-REFERENCE TO RELATED APPLICATION

This application claims priority to U.S. Provisional Application Ser. No. 63/090,944, filed Oct. 13, 2020 under the title, "MICROMAGNET PUF READOUT USING A QUANTUM DIAMOND MICROSCOPE," the entirety of which is hereby incorporated herein by reference.

STATEMENT OF GOVERNMENT RIGHTS

This invention was developed under Contract No. DE-NA0003525 awarded by the United States Department of Energy/National Nuclear Security Administration. The Government has certain rights in this invention.

FIELD OF THE INVENTION

The invention relates to physically unclonable functions (PUFs), and more particularly to passive PUFs that can tag unpowered devices and the like.

Art Background

A physically unclonable function (PUF) is a physical entity, intrinsically built into an object, that is difficult to duplicate and that serves as a unique identifier for the object. Such a unique identifier is often referred to as a "fingerprint". A PUF relies on uncontrollable randomness inherent to the manufacturing process to provide a unique identifier for the object to which it belongs. Many PUF implementations exploit random variations in semiconductor device fabrication. Others use alternative sources of randomness, such as the distribution of fibers in a banknote, or of etch-pit lengths in a compact disc.

PUFs are able to provide security because it is difficult to copy an individual PUF instance. To clone a particular PUF instance, a counterfeiter would need to use a prohibitively sophisticated fabrication method, or would need to perform many trials before randomly producing a convincing copy.

In addition to being easy to manufacture but difficult to copy, a PUF should be easy to characterize, and the output of the characterization procedure should be reproducible. Further, a good PUF should be both random and unique, and ideally, it should be low in cost and robust against environmental variations.

Randomness in patterns of magnetization can be the basis for a PUF technology. For example, magnetic stripe PUF technology exploits the random noise in a magnetic stripe. PUFs of that kind can be used, e.g., in subway tickets, bank cards, and identification cards. One commercial source of devices utilizing magnetic stripe PUF technology is MagTek®, a corporation with headquarters at 1710 Apollo Ct., Seal Beach, Calif.

Even greater benefits could be realized with further improvements of PUFs based on magnetic arrays. For example, greater bit densities would make more compact devices feasible and would make copying more difficult. Our concept offers several potential benefits over magnetic stripe PUF technology. Further, the range of possible applications would be expanded if magnetic-array-based PUFs could be made CMOS compatible. For these reasons, among others, there has been a need for further innovation in the field of magnetic-array-based PUFs.

SUMMARY OF THE INVENTION

We have fabricated arrays of micromagnets in the form of ferromagnetic needles several micrometers in length and spaced about 10 μm apart. We have found that such an array can serve as a useful PUF useful to provide hardware security against counterfeiting, among other applications.

The PUF functionality arises because the individual magnetization state (also referred to here as the "polarity") of each micromagnet is random, uncontrollable, and robust against external influences such as ambient magnetic field and temperature. In examples, the polarity of each micromagnet is treated as encoding a binary 0 or 1. A string of micromagnet states can thus be taken as generating a unique identification code (also referred to here as a "fingerprint") that is useful, e.g., to distinguish between genuine and counterfeit devices.

The magnetization of each micromagnet would conventionally be performed by raster scanning with a single-pixel magnetometer such as a SQUID microscope or a magnetic force microscope. However, raster scanning across a full-sized array of, e.g., 10,000 micromagnets would constitute a time-consuming bottleneck.

We have addressed this problem by using a quantum diamond microscope (QDM) to read the magnetization pattern of the array. A QDM instrument could be used to measure all of the micromagnets of the array simultaneously. This is performed by making measurements of fluorescence quenching in a sensor, as detected in an optical fluorescence microscope. In such a system, we have demonstrated micrometer-scale spatial resolution, a field of view of several millimeters, and high sensitivity combined with fast readout time.

The sensor is a diamond chip with a thin sheet (typically 10 nm to a few micrometers thick) of magnetically sensitive nitrogen-vacancy (NV) color centers at its surface. The thickness of the surface layer may be anywhere from about 10 nm to several micrometers. The NV centers fluoresce when illuminated with green laser light. The fluorescence intensity indicates the magnetic field that each NV experiences. The diamond chip is placed NV-side-down on a micromagnet array, and both are placed in an optical fluorescence microscope.

The fluorescence intensity from each NV center is responsive to the local magnetic field that it experiences due to the nearby micromagnets in the array. The microscope forms a fluorescence image of the entire NV layer (or from as much of it as within its field of view), which is recorded in a CCD camera. The magnetic field response in each pixel can be extracted from the electronically recorded image, This yields a two dimensional (2D) map of the magnetic field measured by the NV layer, from which the polarity of each micromagnet in the array can be extracted.

Raster scanning is beneficially avoided, because the measurement operation measures the magnetic field from all pixels in parallel. An incidental benefit is that measurement drift that is common to all pixels is easily removed. Another advantage of this approach is the large field of view, which as noted above is on the order of one millimeter.

Another advantage is the small sample-to-sensor separation that can be achieved, which is typically a few micrometers. We also refer to this separation as the "standoff distance". With such a small separation between the sample and the sensor, micrometer-scale features on the micromagnet array can be resolved. Consequently, individual micromagnets can be read out even when they are packed together at a relatively high density. This, in turn, makes it possible to generate fingerprints consisting of relatively long strings of binary bits.

Because magnetic dipole fields fall off as the cube of distance, reducing the standoff distance can substantially increase the local field at the sensor. That, in turn, can lead to greater signal-to-noise ratios, shorter measurement durations, and improved sensitivity to weaker magnetic sources.

The measurement operation can be performed in ambient conditions, using off-the-shelf components, and without any need for cryogens, ultrastable lasers, vibration isolation, or vacuum. This reduces the hardware complexity and setup time that might otherwise be called for.

In example implementations, each micromagnet is magnetized in one of two opposite directions, which we refer to for convenience as "up" and "down", along the longitudinal axis of the magnetic needle. One direction is designated as indicative of a binary 0, and the other as indicative of a binary 1. A plurality of such binary bits can be strung together as a randomly generated identification code. Because the polarity of each micromagnet is random and uncontrollable, each micromagnet array is unique and irreproducible. The selection of a packing density for a micromagnet array suitable as a fingerprint for, e.g., an electronic device, involves a tradeoff, because increasing the density offers more uniqueness and better security, but it will eventually run up against the limited spatial resolution of the NV sensor.

By way of example, we have made successful prototypes in which the micromagnets were packed approximately 10 μm apart, and with experiments on variably spaced rows of micromagnets, we showed that a spacing as small as about 5 μm is feasible.

We found that the QDM provided a sensitive readout method. By way of example, we achieved, in trials, a signal-to-noise ratio sufficiently large to enable us to extract the micromagnet polarities after a few seconds.

One useful application for our new micromagnet-array PUF is to fingerprint sensitive application-specific integrated circuits (ASICs) for counterfeit protection. In another potential application, a micromagnet array PUF with QDM readout could be used as a physical cryptographic key. This would be advantageous in situations where storing the key electronically was undesirable.

It should be noted that the QDM can reconstruct the magnetic moments of micromagnets along arbitrary directions, and not merely along the "up" and "down" directions discussed above. This ability to sense arbitrary vector magnetic field components $\{B_x, B_y, B_z\}$ can potentially be utilized to read out PUF arrays with multidimensional magnetization, offering greater randomness and improved security.

Accordingly, the invention in a first aspect relates to a method of reading a magnetic PUF disposed on a substrate. The method comprises creating a magnetization map of the PUF from the signal output of a quantum diamond microscope (QDM) and converting the magnetization map to a numerical sequence. Optionally, the QDM can examine the PUF through a visually opaque layer, which may offer advantages such as enhanced security.

The magnetization map is created from, e.g., measurements of magnetic dipole fields of individual micromagnets in the PUF. In embodiments, the micromagnets are arranged in an array having mutually orthogonal primary and secondary axes, and the micromagnets have random magnetic polarities that are each either parallel or antiparallel to the primary axis. According to some embodiments, each of the micromagnets is assigned a 0-bit or a 1-bit according to its polarity, and the assigned bits are arranged into a binary sequence.

In embodiments, the magnetization map is created, in part, by imaging a pattern of NV fluorescence onto a plurality of pixels of a focal plane array. Thus, for example, the pixels of the focal plane array may be grouped into cells corresponding to respective micromagnets of the PUF, and the polarity may be determined for each cell. In an example procedure, the determination of polarities comprises dividing each cell into a top half and a bottom half, each said half having a respective magnetization value, and for each cell, subtracting one of the two magnetization values from the other one.

The imaging is carried out, for example, by placing a probe of the QDM in proximity to the array of micromagnets such that the entire array is sensed in parallel by the probe. That is, all of the micromagnets are sensed concurrently rather than sequentially. Accordingly, there may be formed in the focal plane of, e.g., an electronic camera, a fluorescence image of the probe that is representative of a collective state of magnetization of all micromagnets of the array in parallel. The resulting image can be processed to create the magnetization map.

In some embodiments, the method is carried out in a magnetic bias field that is automatically optimized. The optimization uses feedback from optically detected electron spin resonance (ESR) of an NV diamond probe to jointly optimize three orthogonal components of the magnetic bias field.

In examples, the magnetic bias field is optimized to lie along an axis selected from four possible NV axes. The feedback is provided by ESR spectra containing signals from NVs aligned along each of the four possible NV axes. Degeneracy of the signals from NVs aligned along the non-selected axes is used as an indication that the magnetic bias field is aligned along the selected axis. The optimization is carried out to optimize currents in, e.g., a three-axis Helmholtz coil set. In embodiments, the optimization procedure aims to produce, first, an optimized positive bias field $B_+$, and then an optimized negative bias field $B_-$ that is equal and opposite to $B_+$.

Some embodiments include an automatic procedure for jointly optimizing a power level of a microwave input to the QDM and a power level of a laser input to the QDM before examining the PUF. The optimization uses feedback from optically detected ESR of the NV diamond probe. For example, the optimization may search over a two-dimensional (2D) space defined by microwave power and laser power. In embodiments, the probe is used to measure an ESR spectrum for each of a plurality of points of the 2D space. A triplet consisting of a linewidth, an amplitude, and an intensity is evaluated for each spectrum, and a sensitivity value is determined from each triplet. Then, an optimal sensitivity value can be selected, and the corresponding combination of microwave power and laser power can be designated as the optimal power combination.

In embodiments, the creation of the magnetization map comprises grouping the pixels of the focal plane array into cells corresponding to respective micromagnets of the PUF, wherein the cells have a density of at least $1 \times 10^4$ per square millimeter of PUF surface area. In more specific embodiments, the cells have a density in the range $1\text{-}4 \times 10^4$ per square millimeter of PUF surface area.

The invention in a second aspect relates to a PUF formed on a substrate and comprising a microfabricated array of randomly polarized nickel micromagnets having an areal density of at least 1×10⁴ micromagnets per square millimeter. A visually opaque layer may overlie the PUF.

DETAILED DESCRIPTION

In an example embodiment, a PUF is based on the random magnetization directions in an array of fabricated micrometer-sized ferromagnetic bars (micromagnets) on a silicon wafer. In embodiments, the readout is performed by NV optical magnetic imaging, although other types of magnetic readout are also possible.

NV optical magnetic imaging is known. For example, NV widefield magnetic imaging has been used to study the magnetic domains in a hard drive, superconducting and ferromagnetic phase transitions, and current flow in graphene, as well as other applications in geology and biology. NV magnetic imaging is discussed in the papers listed below, among others. Each of the following is hereby incorporated herein in entirety:

D. R. Glenn et al., *Geochemistry, Geophysics, Geosystems* 18, 3254 (2017).

D. A. Simpson et al., *Scientific reports* 6, 1 (2016).

M. Lesik et al., *Science* 366, 1359 (2019).

Y. Schlussel et al., *Phys. Rev. Applied* 10, 034032 (2018).

J.-P. Tetienne et al., *Science Advances* 3 (2017), 10.1126/sciadv.1602429.

D. Le Sage et al., *Nature* 496, 486 (2013).

I. Fescenko et al., *Phys. Rev. Applied* 11, 034029 (2019).

The quantum diamond microscope. Nitrogen-vacancy (NV) centers are lattice defects in diamond that fluoresce red when excited with green light at a wavelength of 532 nm.

Figure 1:
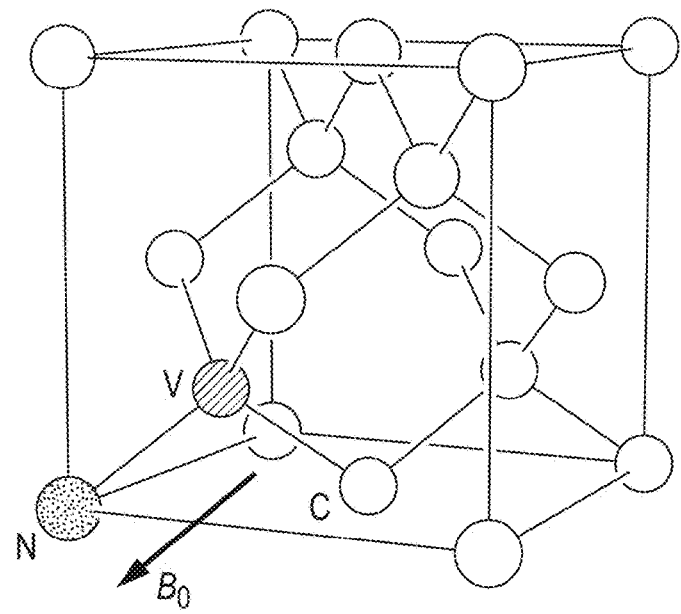
FIG. 1 is a diagram of a unit cell of the diamond crystal lattice, including an NV center.

FIG. 1 is a diagram of a unit cell of the diamond crystal lattice, including an NV center. As shown, each lattice site is occupied by a carbon atom C, except for two neighboring lattice sites that are respectively occupied by a vacancy V and a nitrogen atom N. The vacancy and the nitrogen atom together constitute the NV center. The alignment between the V site and the N site is along the [111] crystallographic direction or along one of three other directions in the <111> family.

The detection mechanism in the quantum diamond microscope (QDM) works by optically detected magnetic resonance (ODMR). There are several well-known schemes of ODMR spectroscopy that can be useful in the context of the QDM. All of these schemes use microwave excitation (as well as optical excitation) of the NV centers, but they differ regarding the use of optical and microwave pulses and regarding the preparation of excited states of the NV centers.

More specifically, the continuous wave (CW) scheme of ODMR uses continuous optical and microwave irradiation. By contrast, the pulsed ODMR scheme and the Ramsey spectroscopy scheme use a laser pulse for optical pumping. Before a measurement is made, the NV excited state is manipulated by application of a microwave pulse. The CW scheme, which we used in the work described here, is advantageous because it is well adapted for measurements over relatively large areas.

In the CW scheme, a laser or other suitably tuned light source optically pumps the NV centers to a fluorescent state, often referred to as the "bright" state. A microwave field, if it is at a resonant frequency, can quench the fluorescence. The resonant frequency depends on the strength $B_{\parallel}$ of the magnetic field component parallel to the axis of the NV center. Accordingly, $B_{\parallel}$ can be measured by sweeping the microwave frequency through resonance and observing the frequencies where there is fluorescent quenching as indicated by the output of a photodetector.

Turning again to FIG. 1, it will be seen that an arrow labeled $B_0$ has been included in the figure. This represents a bias magnetic field, typically of 10-20 gauss in strength, that is applied to the NV centers to resolve the various resonances so that they can be read. Another reason to add the bias field is because the NV response to a very weak field is sub-linear. Adding a bias field can shift the response into the linear domain, which simplifies signal interpretation.

Figure 2:
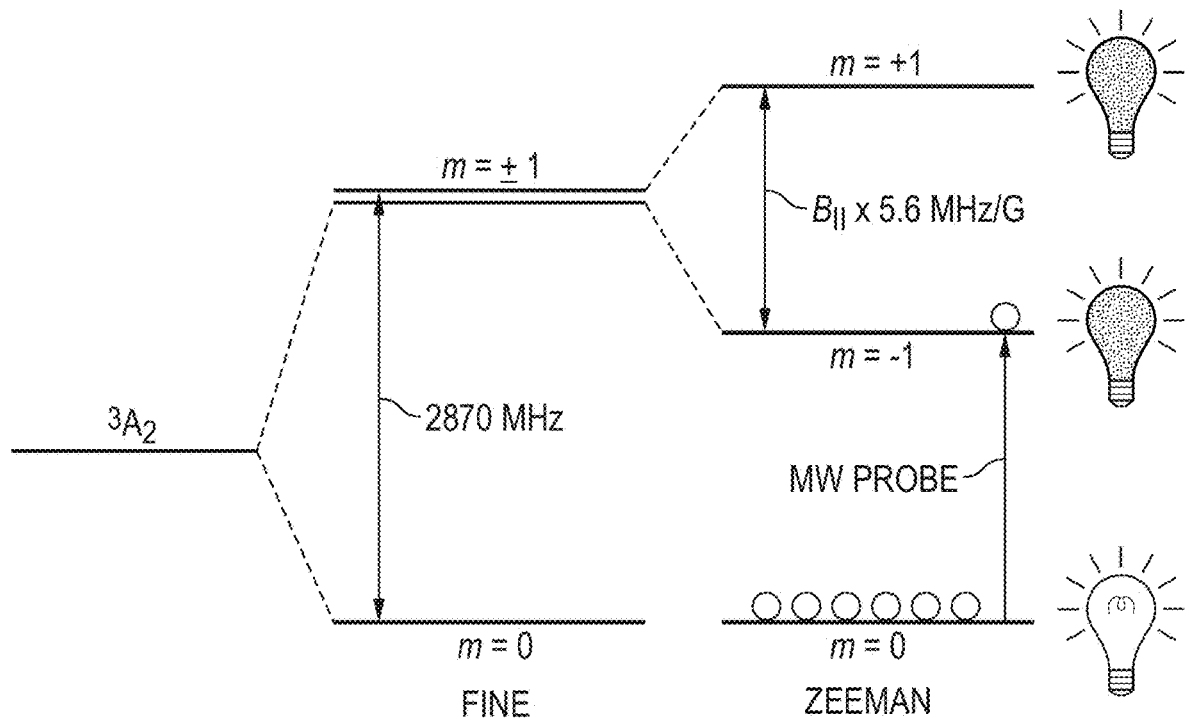
FIG. 2 is an energy-level diagram showing the transitions involved in the detection mechanism of the NV microscope, i.e., the QDM.

FIG. 2 is an energy-level diagram showing the transitions involved in the detection mechanism of the QDM. As noted above, the NV-center ground state is magnetically sensitive. More specifically, it has a fine-structure splitting between the m=0 quantum state and the m=−1 and m=+1 states, with an energy difference equivalent to a microwave frequency of 2870 MHz. In a magnetic bias field of strength $B_\parallel$ parallel to the [111] crystal axis, there is a further Zeeman splitting of $B_\parallel \times 5.6$ MHz/G.

A laser emitting at 532 nm can pump the NV centers to the fluorescent "bright" state. At resonance, the microwave field can quench the fluorescence by driving a transition from m=0, which is "bright", to m=−1 or m=+1, which are dark states.

Figure 3:
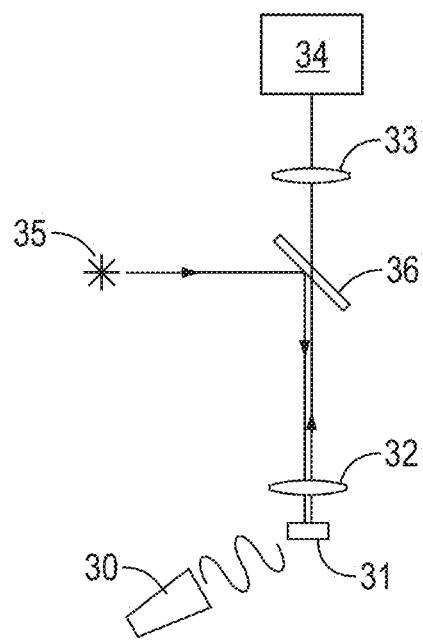
FIG. 3 is a simplified block diagram, provided for pedagogical purposes only, illustrating how detection could be carried out using a QDM.

FIG. 3 is a simplified block diagram, provided for pedagogical purposes only, illustrating how the detection could be carried out. In the figure, microwave probe 30 irradiates diamond-chip probe 31. The fluorescent response of the diamond chip is imaged by objective 32 and eyepiece 33 onto photodetector 34. The fluorescence is excited by pump laser 35. The pump light from laser 35 is reflected onto the diamond chip by dichroic mirror 36, which is transmissive to the fluorescence from the diamond chip.

The spectrum generated by plotting fluorescence intensity against microwave probe frequency exhibits a complex structure. There are two microwave resonances for each NV center, namely the excitation from m=0 to m=−1 and the excitation from m=0 to m=+1.

Figure 4:
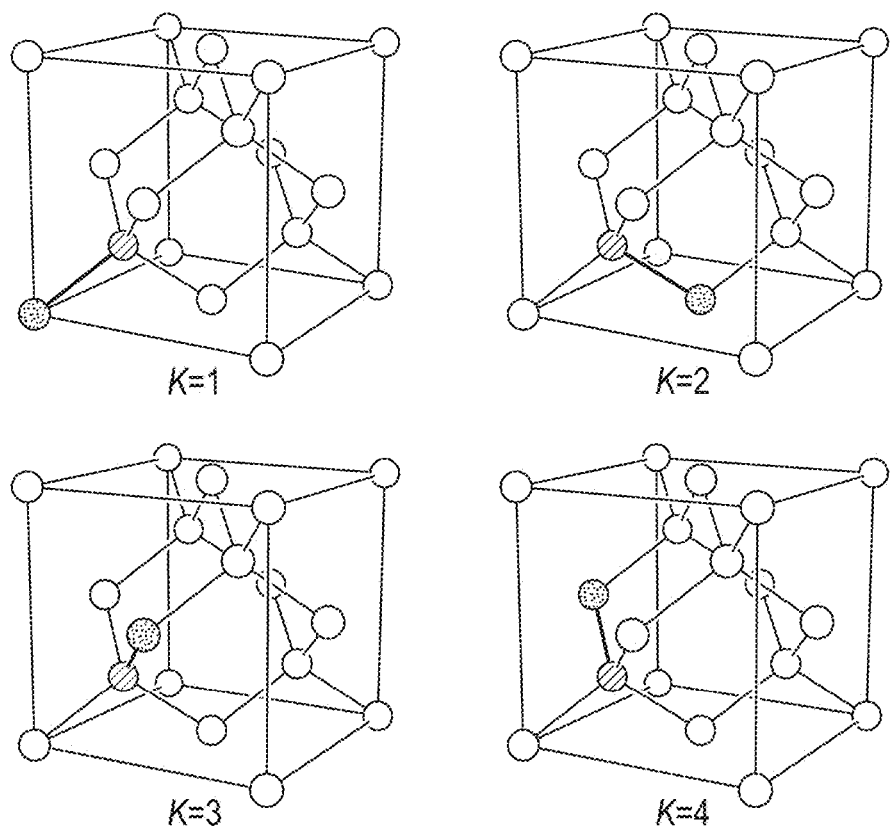
FIG. 4 shows the four equivalent orientations for NV centers within the diamond crystal lattice.

In addition, the NV centers are aligned, as noted above, along four respective axes within the diamond crystal. FIG. 4 shows the four equivalent orientations for NV centers within the diamond crystal lattice. These axes are crystallographically equivalent, but only one orientation at a time can be parallel to the bias field. Hence, the component of the applied bias field that is parallel to the NV center orientation will be different for each of the four possible alignments. In the spectrum, each of these four alignments will give rise to a pair of peaks, one for the m=−1 end state and one for the m=+1 end state.

Further, each of the eight resulting peaks is resolved into a triplet by hyperfine splitting.

Figure 5:
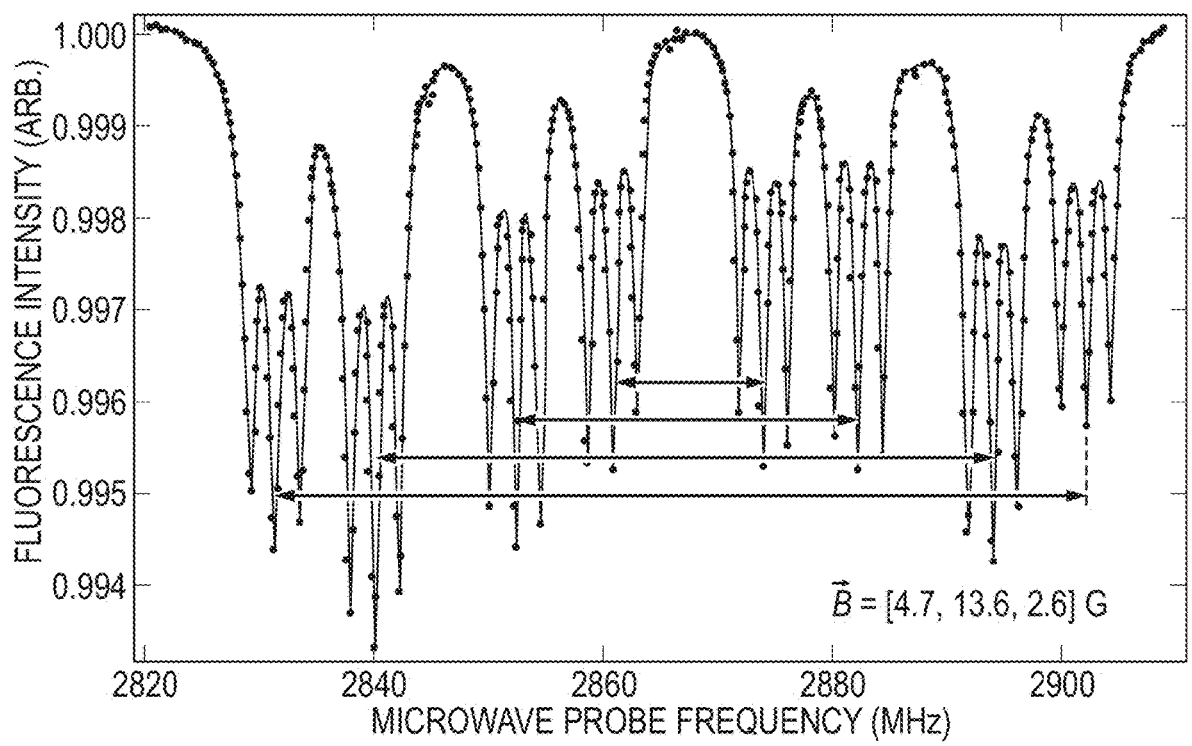
FIG. 5 is an example NV fluorescence spectrum, in which the fluorescence intensity is plotted against the microwave probe frequency.

FIG. 5 is an example fluorescence spectrum, in which the fluorescence intensity is plotted against the microwave probe frequency. As indicated in the figure, the magnetic bias field has a vector value of (4.7, 13.6, 2.6) gauss, relative to the laboratory reference frame of the diamond chip. For the particular diamond chip probe that was used, the x- and y-axes were in the [1 1 0] and [1 −1 0] crystal directions, respectively.

Horizontal, double-headed arrows superimposed on the figure indicate the four pairs of resonances corresponding to the four respective NV-center orientations. As seen in the figure, each resonance is split into three peaks due to the hyperfine splitting.

In NV microscopy, the microwave resonances are shifted because the local magnetic fields exerted by the sample adds to the external bias field, which is typically applied by a set of Helmholtz coils. These shifts are detected, pixel-by-pixel, in the focal plane array of an imaging device. Image-processing techniques are then used to create a map of the strength and orientation of the local field as measured at each pixel.

Figure 6:
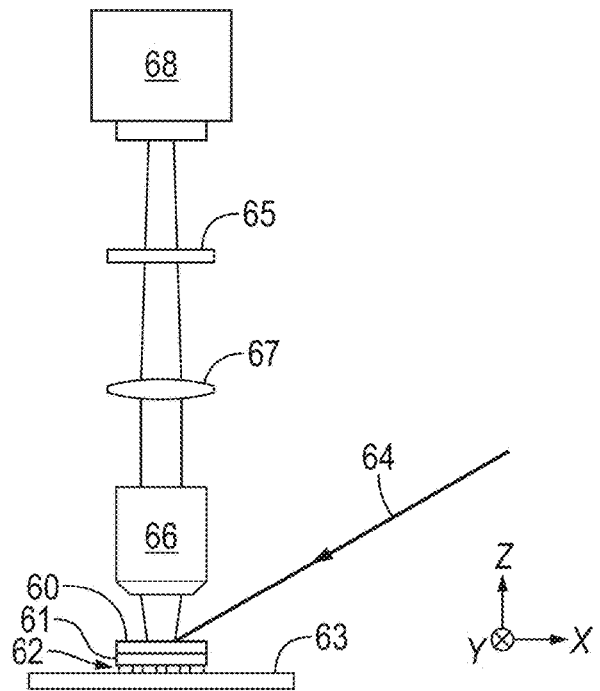
FIG. 6 shows the schematic layout for illustrative NV magnetic imaging experiments that we have performed.

Experimental approach. FIG. 6 shows the schematic layout for illustrative NV magnetic imaging experiments that we have performed. As shown in the figure, the diamond chip has a substrate layer 60 without NVs and an NV layer 61 for sensing. The NV layer is brought into proximity to a layer 62 of micromagnets on a silicon substrate 63. An off-axis (in the figure view) beam 64 of 532-nm laser light impinges the NV layer through the face opposite to the NV layer, exciting fluorescence that is isolated by 650-nm long-pass filter 65 and imaged by objective 66 and eyepiece 67 onto camera 68.

For reference, a set of coordinate axes is included in the figure. As shown, the fluorescence is imaged onto the camera in the positive z-direction along the optic axis of the microscope. The positive x-direction is to the right in the figure view, and the positive y-direction is out of the page in the direction away from the viewer.

Figure 7:
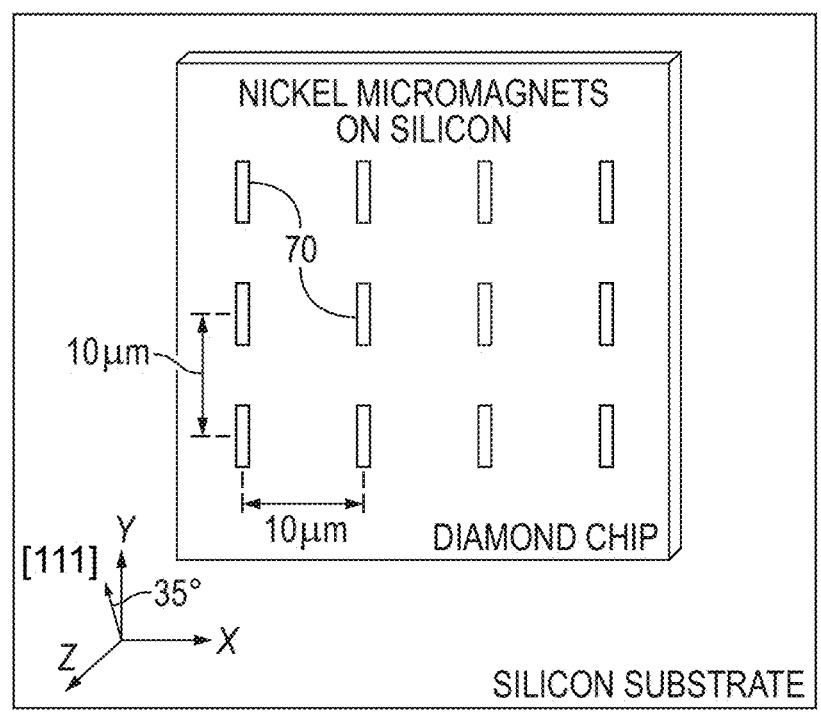
FIG. 7 is a plan view of an example micromagnet array on a silicon substrate, according to principles described here.

FIG. 7 is a plan view of an example array of nickel micromagnets 70 on a silicon substrate. The micromagnets, sized 1 μm×4 μm, are arranged in a rectangular lattice with a spacing along the x-axis of 10 μm and a center-to-center spacing along the y-axis of 10 μm. An inset in the figure shows the [111] crystal axis direction, which in this particular arrangement is oriented at an angle of 35° to the y-axis.

Each micromagnet in the array has an easy magnetic axis that constrains the magnetic moment to be oriented in one of two directions (along the positive or negative y-direction in the figure view). These micromagnets have random magnetic moment orientations (polarities) at the time of fabrication. The combination of these random polarities serves as the unique identifier for the PUF.

We used nickel as an initial trial material, as nickel micromagnets are simple to fabricate and have a high enough remanence and coercivity to preserve their magnetic moments in fields of several millitesla (mT).

The magnetic field map of an individual micromagnet (measured a few micrometers away) is well described by a magnetic dipole along the ±y direction, and we use an NV magnetic imaging setup to obtain the polarity of each micromagnet in the array.

Figure 8:
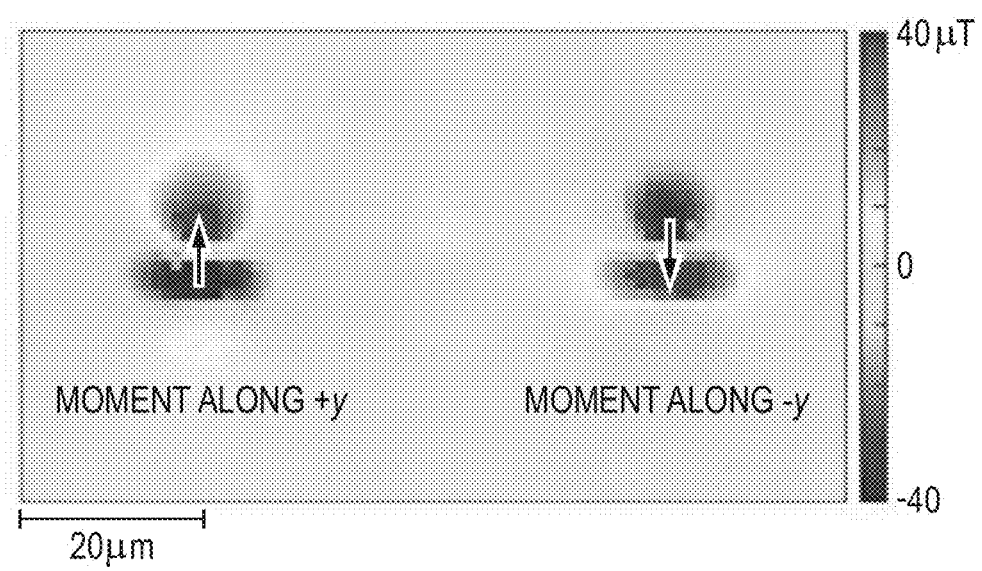
FIG. 8 is an example field map of Biii, the magnetic field component in the [111] direction of an NV microscope probe, from two isolated micromagnets having respective moments along the +y and −y directions.

FIG. 8 is an example field map of $B_{111}$, the magnetic field component in the [111] direction, from two isolated micromagnets having respective moments along the +y and −y directions. The range of field values represented in the figure is approximately from −40 μT to +40 μT.

Unlike a microscope based on the magneto-optic Kerr effect (MOKE), which exploits the Faraday rotation of reflected light from a magnetized surface, the NV magnetic imager measures magnetic fields in a plane above the sample. As a consequence, the micromagnet PUF can be isolated beneath a protective layer, which can be visually opaque. Thus, the micromagnets can be protected from oxidation as well as from visual access by a counterfeiter, while still permitting them to be read by the NV magnetic imager. As will be discussed in more detail below, we have found that in embodiments, as many as $10^4$ micromagnet states can be read out in a few seconds.

Micromagnet array fabrication. In an example process, nickel micromagnet arrays were fabricated on a silicon substrate overlain by a thermal oxide layer 1 μm in thickness. Patterning of 950A7 PMMA resist was performed by 30-keV electron-beam lithography. The patterned resist was developed in MIKB/IPA (1:3). Then, 50 nm of nickel was deposited, followed by lift-off.

An illustrative micromagnet array made by this process contains $10^4$ micromagnets in a 100×100 grid covering a 1 mm×1 mm square. The array pitch is 10 μm in both the x and y directions. (1 $mm^2$ total area). The dimensions of each individual micromagnet are 1 μm×4 μm.

In addition to fabricating uniformly spaced micromagnet arrays, we also fabricated micromagnets of different sizes and variable spacings that, in examples, were as small as 2 μm. We added a 20-nm $Al_2O_3$ top layer to protect the nickel micromagnets from oxidation.

Analysis of individual micromagnets confirmed that the magnetic field map we measured from each micromagnet was well described by a magnetic dipole model. On that basis, we could extract the effective altitude at which the NV layer measured the micromagnets. That is, we were able to calculate the standoff distance.

Imaging of the variably spaced micromagnets also enabled us to determine a smallest-resolvable micromagnet spacing.

Magnetic microscopy readout. In imaging experiments, we placed a diamond chip with a 4-μm NV layer, grown with isotopically enriched $^{12}C$ abundance, on top of the micromagnet array. By the process of fluorescence microscopy described above, and with imaging of the NV fluorescence intensity onto a camera sensor, we obtained a pixel image of the local magnetic fields at the NVs. From the recorded image, we obtained the polarity of each micromagnet in the array. Our instrument for NV magnetic microscopy instrument had a spatial resolution of several micrometers and a pixel size of 1.09-μm with a field of view of several millimeters, and it had a magnetic noise floor of about 7 μT in a 1 μm×1 μm pixel area after 1 second of averaging, operating under ambient conditions.

Experimentally, we measured the magnetic field projection $B_{111}$ along the NV [111] crystallographic direction, which points approximately 35° out of the image plane, as indicated in FIG. 7. This procedure is an example of projection magnetic microscopy, which is discussed, for example, in D. R. Glenn et al., *Geosystems* 18 (2017), which was cited above.

To simplify the micromagnet array image analysis, we converted the $B_{111}$ map to a $B_z$ map, which is the magnetic field component along the z-axis. The mathematical processing to effectuate this conversion is discussed, for example, in E. A. Lima et al., *Journal of Geophysical Research: Solid Earth* 114 (2009), the entirety of which is hereby incorporated herein by reference. The following is a brief description of the procedure for generating the $B_x(x,y)$ and $B_y(x,y)$ magnetic components from a measured $B_z(x,y)$ map:

After calculating the 2D Fourier transform $b_z(k_x,k_y)$, where $k_x$ and $k_y$ are spatial frequencies, we write $$b_x(k_x, k_y) = \frac{-ik_x b_z(k_x, k_y)}{\sqrt{k_x^2 + k_y^2}}, \quad b_y(k_x, k_y) = \frac{-ik_y b_z(k_x, k_y)}{\sqrt{k_x^2 + k_y^2}}.$$

In our example detection procedure, we measure $$B_{111}(x, y) = \sqrt{\frac{2}{3}} B_y(x, y) + \sqrt{\frac{1}{3}} B_z(x, y).$$

The Fourier transform of both sides of the above expression yields $$b_{111}(k_x, k_y) = \sqrt{\frac{2}{3}} b_y(k_x, k_y) + \sqrt{\frac{1}{3}} b_z(k_x, k_y).$$

Solving the above expressions, we get $$b_z(k_x, k_y) = \frac{b_{111}(k_x, k_y)}{\sqrt{\frac{2}{3}} \left( \frac{-ik_y}{\sqrt{k_x^2 + k_y^2}} \right) + \sqrt{\frac{1}{3}}}.$$

The inverse Fourier transform of the above expression yields the desired $B_z(x,y)$ map.

Since NV magnetic microscopy reads out the magnetic information optically, it is possible to overlay magnetic and white-light optical images to constrain the micromagnet locations.

Figure 9:
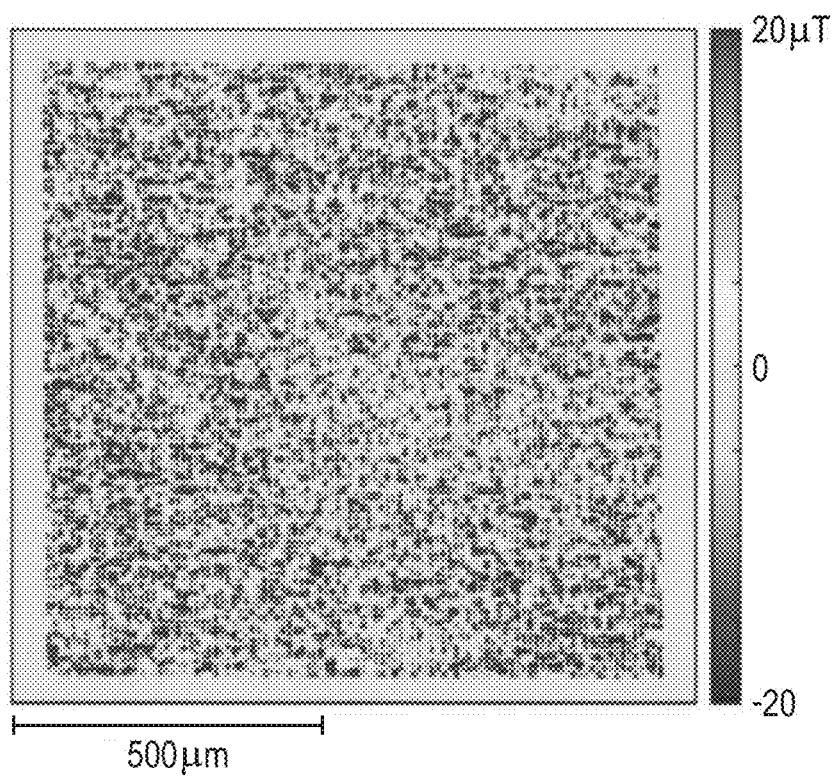
FIG. 9 is the magnetic image of a micromagnet array fabricated according to principles described here.

FIG. 9 is an example of a $B_z$ magnetic map of a micromagnet array fabricated as described above. The magnetic map was measured with our NV magnetic imaging instrument in a 20-minute experiment. This measurement duration was chosen to give a signal-to-noise ratio (SNR) of about 100. Alternatively, the duration could be shortened to a few seconds while still having enough sensitivity to acquire the micromagnet polarities.

The image in FIG. 9 is that of a 100×100 micromagnet array with 10-μm spacing. The range of field strengths represented in the map is from approximately −20 μT to approximately 20 μT. To generate the map, we first measured the magnetic field projection onto the NV [111] direction ($B_{111}$), and then calculated the $B_z$ map from the $B_{111}$ map.

Figure 10:
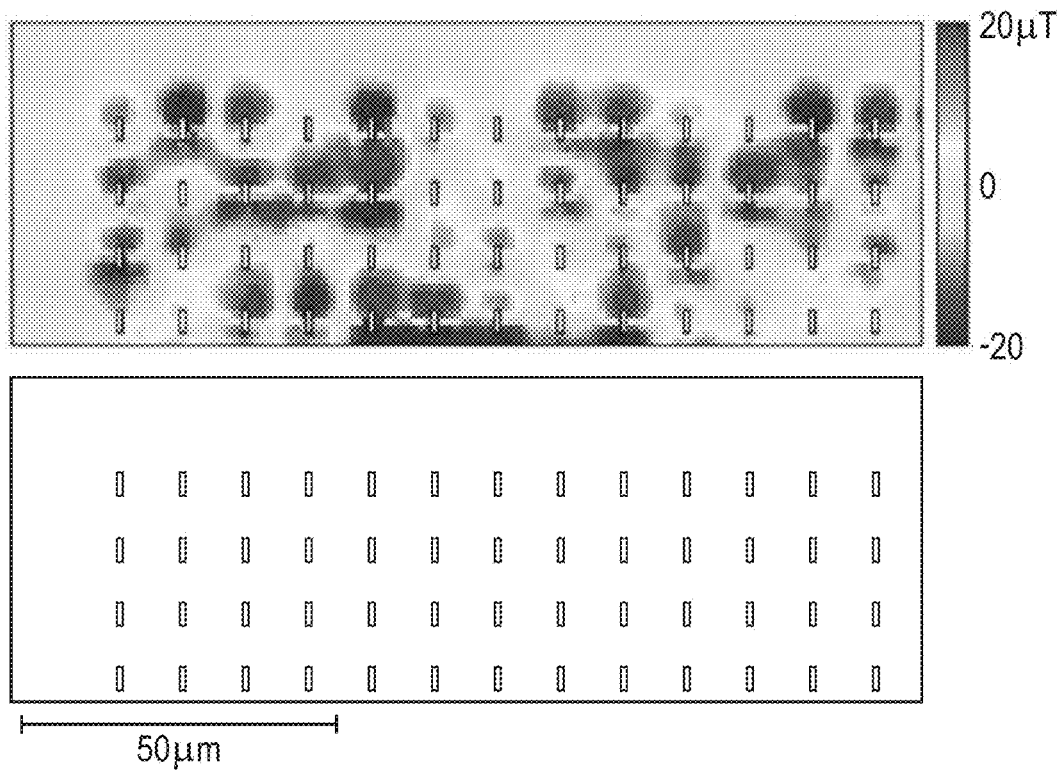
FIG. 10, top view, is a magnified view of the top-left corner of the image of FIG. 9, with the micromagnet locations drawn as an overlay. The bottom view in FIG. 10 is an optical image of the same area that is shown in the top view of the figure.

The top view in FIG. 10 is a magnified view of the top-left corner of the image of FIG. 10, with the micromagnet locations drawn as an overlay. The bottom view in FIG. 10 is an optical image of the same area that is shown in the top view of the figure.

Given that our magnetic sensitivity was about 7 μT after 1 second in a 1 μm×1 μm area, we imaged the approx. 20-μT typical field strength of the micromagnet array of FIG. 9 with a 0.2-μT noise floor (1%) after about 20 minutes. Accordingly, the $10^4$ bits were read out at a readout rate of 8 bits per second.

As those skilled in the art will appreciate, the SNR and measurement duration could be improved with stronger micromagnet moments, a closer standoff distance, and a better magnetic noise floor.

Magnetic $B_z$ image-to-bit-string conversion. Given a measured $B_z$ map, image analysis techniques can be used to analyze the magnetic polarity of each micromagnet in the array. An example procedure for analyzing the magnetic polarities is presented below.

Since the micromagnet array may be slightly rotated in the NV magnetic image, we first align the magnetic array with the coordinate basis of the camera in order to simplify the analysis. This is done by first using Canny edge detection to define edges of regions with and without micromagnet $B_z$ fields, then applying a convex hull-finding algorithm to find the polygon that encloses all of the points found by edge detection. The slopes of the lines that define the hull indicate the rotational offset angle of the micromagnet array in the magnetic image. The coordinate bases are aligned by simply rotating the data by this angle. By way of example, the rotational offset angle in the image of FIG. 9 was 1.3°.

Canny edge detection is discussed, for example, in J. Canny, Readings in Computer Vision (Elsevier, 1987) pp. 184-203.

Once the micromagnet grid has been rotated into the x-y basis of the image, we identify the {x, y} coordinates of each micromagnet by dividing the rectangular area containing the micromagnet fields into a 100×100 grid of cells, each containing the $B_z$ field map from a single micromagnet.

Exploiting the fact that the $B_z$ magnetic map for a dipole along the y-axis has symmetric positive and negative lobes, we individually sum the $B_z$ field strengths from the top half and the bottom half of each cell, respectively, and then take the difference $\Delta B$ between the respective sums. That is, $\Delta B = \Sigma B_{top} - \Sigma B_{bottom}$. If $\Delta B > 0$, the cell is assigned a 1 state for the bit string (i.e., it has a moment along +y), and if $\Delta B < 0$, the cell is assigned a 0 (i.e., it has a moment along −y).

Using this method, we are able to reliably convert a $B_z$ magnetic map to a bit string for further analysis. This method yields the sign of each dipole moment in the array. Although this method does not yield the amplitudes of the dipole moments, the sign information is sufficient to generate a bit string.

Our $B_z$ image-to-bit-string conversion method is well suited to this work, due to its simplicity and robustness. Alternative approaches include fitting every micromagnet to extract the vector moments, using spatial convolutions or matched filters to locate and analyze each micromagnet, and comparing the magnetic field maps from different micromagnet arrays using image comparison software tools. The last of these may be particularly useful when the micromagnets are too close together to resolve individually.

Standoff distance and spatial resolution. For PUF fingerprints based on individually resolved micromagnet polarities, the maximum micromagnet areal density will be limited by the spatial resolution of the NV magnetic imager. The spatial resolution is determined by the largest of: (i) the air gap between the NV layer and the micromagnets, (ii) the NV layer thickness, and (iii) the optical diffraction limit.

Attempts to minimize the air gap may be frustrated if the diamond and sample layers are not flat, or if unwanted dust particles are trapped between them. Moreover, the effective standoff distance tends to be greater if the NV layer thickness is large relative to the sample layer thickness and the air gap, because the NV fluorescence is spatially averaged over a significantly varying distance from the sample.

If the other factors are minimized, the spatial resolution will be set by the optical diffraction limit $\lambda/2NA$, where NA is the numerical aperture and $\lambda$ is the fluorescence wavelength. By way of illustration, our instrument used a microscope objective with NA=0.25, which corresponds to a 1.4-μm diffraction-limited resolution for a typical 700-nm NV fluorescence wavelength. Alternative arrangements could potentially achieve higher resolution by using an objective lens with a higher NA, or by using techniques of optical super-resolution.

From measurements of $B_{111}$ magnetic images of isolated micromagnets, we determined that in our instrument, the sample-diamond air gap (about 1.9 μm) and the NV layer thickness (4 μm) were the main contributors to the standoff distance (3.6 μm), and that optical diffraction did not contribute significantly. For this purpose, we used smaller micromagnets (0.25 μm×1 μm) to emulate point-like magnetic dipoles. We fit the Biii magnetic maps from 58 isolated micromagnets using a magnetic dipole model to arrive at a 3.6-μm mean standoff distance.

Figure 11:
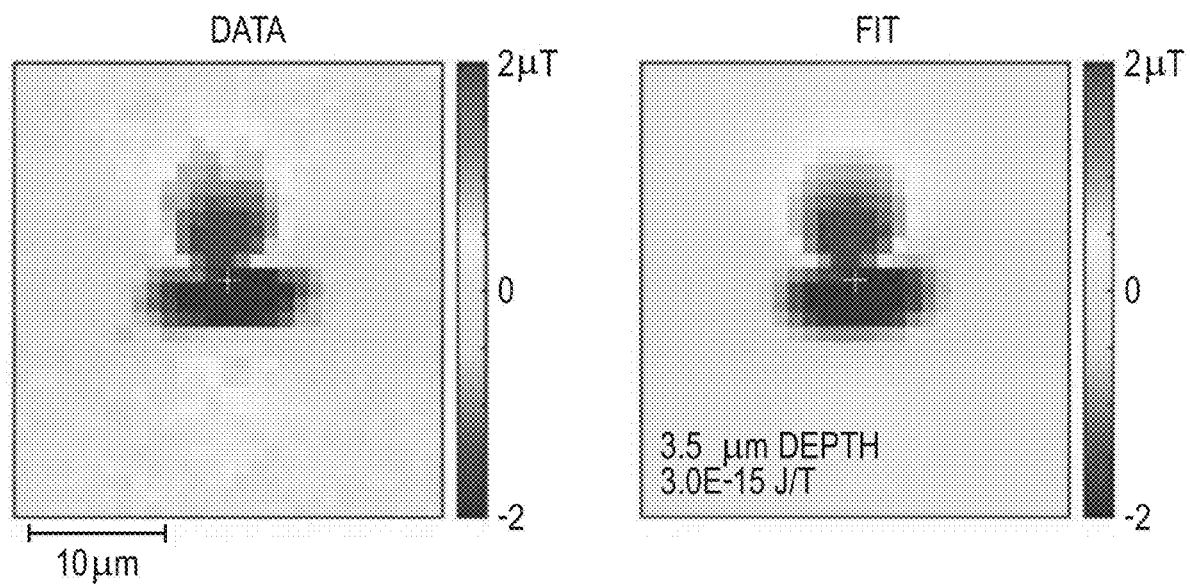
FIG. 11, left-hand view, is a Biii map of a 0.25 µm×1 µm micromagnet measured with a 4-µm NV layer. The right-hand view in FIG. 11 is a numerically processed dipole fit to the data in the left-hand view.
Figure 12:
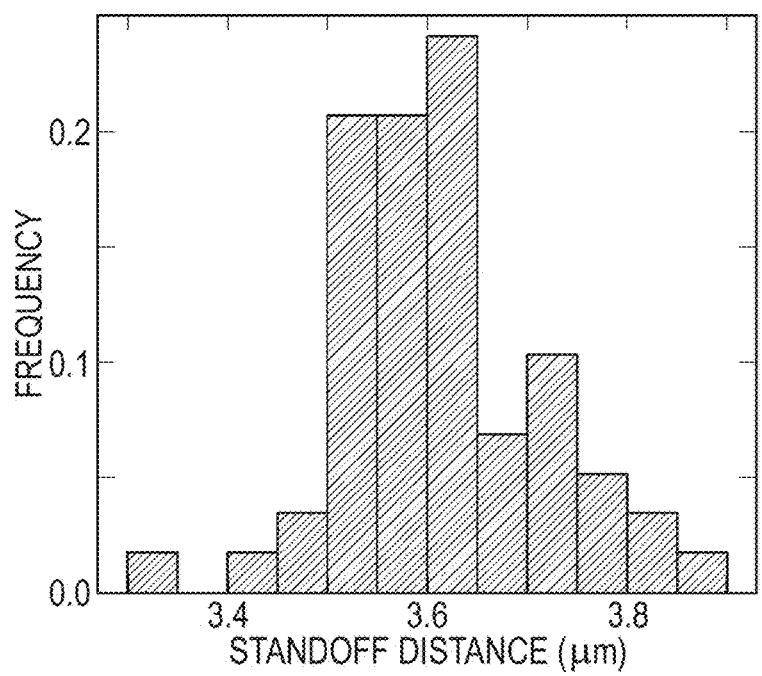
FIG. 12 is a histogram of 58 standoff distances to isolated micromagnets fabricated according to principles described here. The standoff distances were calculated by fitting the Biii magnetic maps from the 58 isolated micromagnets using a magnetic dipole model.

By way of illustration, the left-hand view in FIG. 11 is a $B_{111}$ map of a 0.25 μm×1 μm micromagnet measured with a 4-μm NV layer. The right-hand view is a numerically processed dipole fit to the data in the left-hand view. FIG. 12 is a histogram of 58 fitted dipole standoff distances, showing a mean standoff of 3.6 μm with a 0.1 μm standard deviation.

From simulations, we concluded from the 3.6-μm standoff distance that a micromagnet spacing of at least about 8-10 μm would be needed to spatially distinguish neighboring dipoles.

Figure 13:
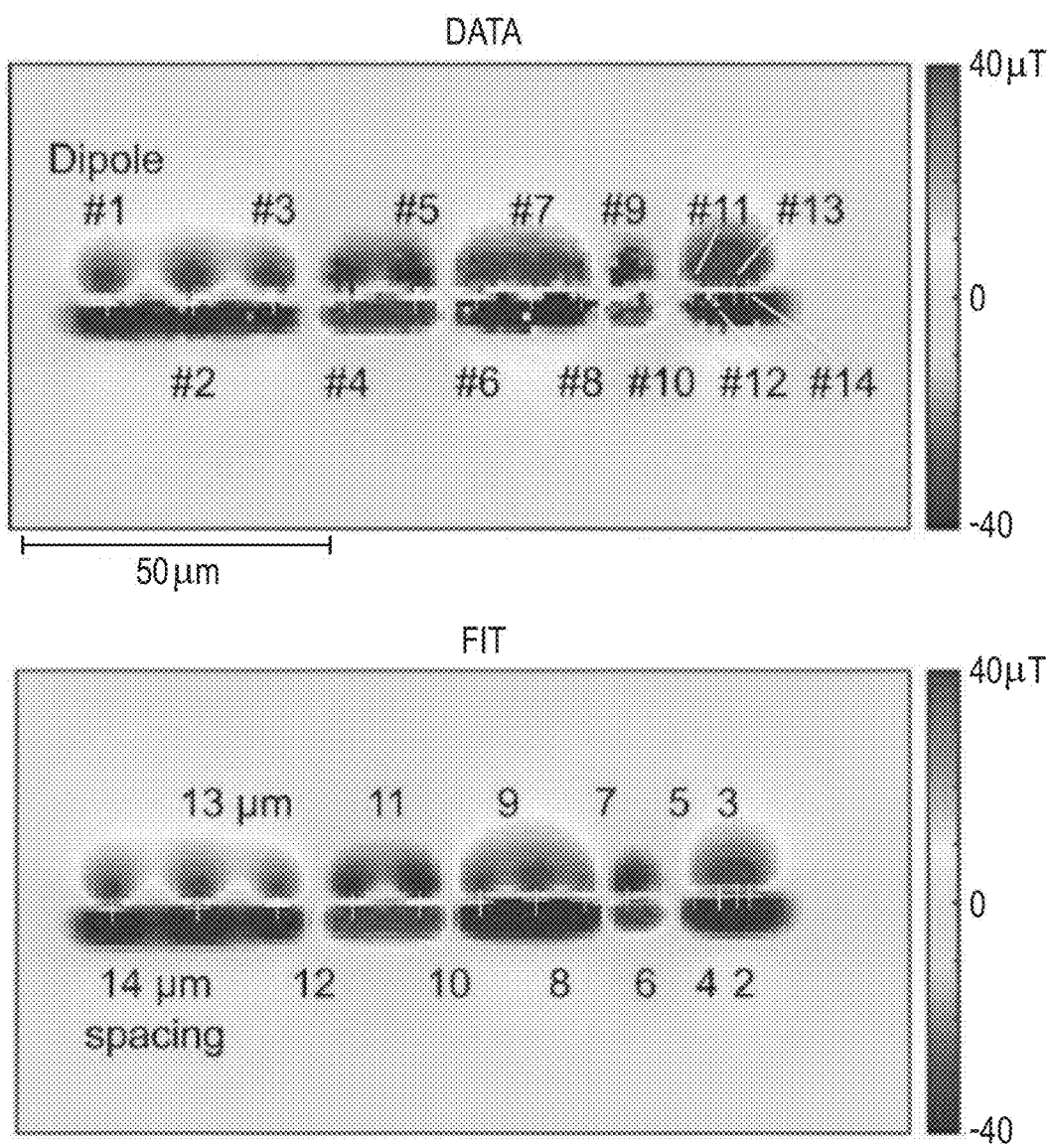
FIG. 13, top view, is a $B_{111}$ magnetic image of a row of fourteen variably spaced micromagnets, sized 1 µm×5 µm. The spacings vary from 2 µm to 14 µm. The bottom image in FIG. 13 is a numerically processed fit of the data in the top image to fourteen dipoles with fixed relative locations.

However, the fact that the micromagnet moments are constrained along the y-axis, combined with knowledge of the micromagnet locations, can be exploited to pack the micromagnets closer together without forfeiting the ability to determine the state of each micromagnet. FIG. 13 is illustrative in this regard. The top view in FIG. 13 is a $B_{111}$ magnetic image of a row of fourteen variably spaced micromagnets, sized 1 μm×5 μm. The spacings vary from 2 μm to 14 μm. The bottom image in the figure is a numerically processed fit of the data in the top image to fourteen dipoles with fixed relative locations. Useful reference in this regard may be made to the following papers:

D. Le Sage, et al., *Nature* 496 (2013), cited above; and

L. V. de Groot et al., *Geophysical Research Letters* 45, 2995 (2018), the entirety of which is hereby incorporated herein by reference.

Turning to the figure, it will be seen that the magnetic field images begin to blend together as the spacing decreases, making it difficult to distinguish between a single micromagnet and several closely spaced micromagnets as the field source. However, given the known micromagnet locations, the fitting routine (as well as the eye) can distinguish each micromagnet state. The dipoles marked as #9 and #10 in the figure are illustrative.

However, the benefit of this additional knowledge is limited. Thus, for example, the dipoles marked as #12, #13, and #14 of the figure are clustered so closely that the fitting routine is satisfied with modeling them as a group of two rather than three dipoles. All of the magnetic moment is assigned to dipoles #12 and #14, while dipole #13 is set to zero.

This example shows that even with a 3.6-μm standoff distance, the additional constraints on micromagnet position and direction of magnetic moment can reduce the minimum spacing to about 5 μm.

However, we found that even with the additional constraints, it was difficult with our instrument to resolve the moments from micromagnets less than 2-3 μm apart.

Micromagnet array PUF figure of merit. One figure of merit for a PUF based on a string of random bits is the total number of bits. We demonstrated $10^4$ bits/mm$^2$. Within the capabilities reported here, this could be improved to $4 \times 10^4$ bits/mm$^2$ with a 5-μm micromagnet spacing. This bit areal density is comparable to the bit areal density of about $5 \times 10^4$ bits/mm$^2$ measured in a 1-GB magnetic hard drive in earlier work involving NV magnetic imaging.

NV imaging of magnetic hard drives is discussed, for example, in D. A. Simpson et al., *Scientific Reports* 6, 1 (2016), which was cited above.

Having $10^4$ random bits corresponds to an upper limit of $2^{10,000}$ unique identifiers, suggesting that random PUF state duplication is unlikely. This areal density is large enough for a compact micromagnet PUF to be usefully fabricated onto a variety of electronics components as a magnetic tag.

Another pertinent figure of merit is the bit readout rate. As noted above, our readout rate for the magnetic map of $10^4$ micromagnets in FIG. 9 with SNR=100 was 8 bits per second. This bit rate can be one hundred times faster if, e.g., the signal-to-noise ratio is relaxed to SNR=10 in a 12-second measurement.

Moreover, when converting the $B_z$ map to a bit string, our algorithm takes sums and differences over an area of approximately 50 μm$^2$ for each micromagnet. This effectively increases the readout rate by a factor of about 7. Combining these factors yields a readout rate of 5800 bits/s.

It is noteworthy in this regard that the bit readout rate is expected to be largely independent of the bit areal density, since increasing the areal density also decreases the area and the SNR for each micromagnet.

Micromagnet bit-string randomness assessment. A PUF should be random if it is to provide the best security against potential counterfeiters. There are numerous statistical hypothesis tests to tell whether a string of binary numbers is consistent with being randomly generated. Statistical tests suitable for evaluating a PUF in this regard are discussed, for example, in A. Rukhin et al, NIST Special Publication 800-22 Revision 1a (2010).

To characterize the randomness of our experimental micromagnet PUF bit string, we used a suite of fifteen statistical hypothesis tests. Each test reports one or more p-value likelihoods of getting such a bit string from a truly random number generator (the null hypothesis). We reject the null hypothesis for p<0.01.

We applied these tests to the bit string obtained from the measurement in FIG. 9. This bit string passed all of the statistical tests except for the Approximate Entropy Test, the Runs Test, and some instances of the Non-Overlapping Template Test.

The Approximate Entropy Test examines the entropy of different bit patterns of length $l$ for all $2^l$ possible patterns (each of which appears in the bit string with frequency $f_i$). The entropy is calculated as $\Sigma f_i \ln f_i$.

The Runs Test counts uninterrupted sequences of identical bits (for example, 011110 contains a run of 1's with length 4) and indicates whether the values in the bit string are fluctuating too quickly or too slowly. Our bit string failed because there were too few runs, suggesting that the micromagnet polarities fluctuated too slowly.

The Non-Overlapping Template Test searches for how often different 9-bit patterns occur to determine whether these patterns appear too frequently. Our bit string passed with 138 patterns out of 148.

It should be noted in this regard that some of the statistical tests, such as the Random Excursions Test, require a longer bit string than we provided, and were therefore not evaluated.

The list of successfully passed tests is: Frequency, Block Frequency, Longest Run, Rank, Discrete Fourier Transform, Overlapping Template, Linear Complexity, Serial $\nabla \Psi^2_m$, Serial $\nabla^2 \Psi^2 m$, Cumulative Sums Forward, and Cumulative Sums Reverse.

Although the outcome was not entirely successful, it was encouraging in view of mitigating circumstances. The micromagnets were prepared in the earth's magnetic field ($B_e \cong 50 \mu T$), leading to a naïve expectation of alignment with the terrestrial field (or other magnetic fields in the lab) during fabrication. Even the weakly magnetized 0.25 μm×1 μm micromagnet discussed above, with a magnetic moment of $3.0 \times 10^{-15}$ J/T, has an energy of $1.5 \times 10^{-19}$ J in the terrestrial field, which is large relative to the Boltzmann energy $k_B T$ at 300° K, which is only $4.1 \times 10^{-21}$.

Furthermore, each micromagnet experiences the magnetic fields from its neighbors, potentially leading to a correlation between neighboring moments in an antiferromagnetic pattern.

Although these factors may reduce the randomness of the bit string extracted from a micromagnet array PUF, it is important to note that our experimental prototype still passed most of the randomness tests without additional processing steps.

Micromagnet coercivity and remanence. NV magnetic sensing is usually done at a nonzero bias field of 1 mT (10 gauss) or higher, which can pose a problem if this field is strong enough to remagnetize the PUF micromagnets. Furthermore, in order to preserve the magnetic moments from the outside magnetic or thermal environment, the micromagnets should be single-domain ferromagnetic, rather than superparamagnetic or multidomain.

The micromagnet material, aspect ratio, and size determine the magnetic coercivity and the remanence of the micromagnetic. It is advantageous to make both of these properties as large as possible.

In our experimental studies, we measured the individual micromagnets we had fabricated with equal and opposite bias fields of ±1.3 mT along the [111] direction and compared the resulting magnetic moments. Although the moments varied by a few tens of percent between the measurements, the polarities (which are used as the PUF identifier) were unaffected.

In alternative embodiments, the use of different materials such as samarium-cobalt may offer better coercivity and remanence than we obtained from nickel.

Further embodiments. Several features are envisaged that would lead to improved performance or increased usefulness in further embodiments of the invention. For example, there is a possible vulnerability to a counterfeiter's copying a micromagnet array PUF by individually magnetizing each micromagnet with a hard-drive read-write head or an MFM tip. Several features can be implemented that would thwart an attack of that kind. One possible countermeasure is to pack the micromagnets closer together. Others are simply to increase the total number of micromagnets fabricated in the array, or to isolate the micromagnets beneath a nonmagnetic protective layer so that it would be difficult to address a particular micromagnet without affecting its neighbors.

The embodiment of our PUF described above is considered a "weak PUF" because it provides only one response state (the magnetic moment bit string) when measured. A "strong" PUF, by contrast, offers more security by having a large database of possible measurements and responses.

Micromagnet PUFs of the kind described above could possibly be made into strong PUFs with suitable adaptations. One such adaptation is to make magnetic hysteresis or first-order reversal curve (FORC) measurements, sampling from a large list of bias magnetic fields.

Other possible improvements would involve optimizing the micromagnet density and the readout SNR. Design parameters that could be varied for that purpose include the micromagnet dimensions and spacing, the micromagnet material, and the NV layer thickness.

However, there would be tradeoffs involving the standoff distance, magnetic moment, measured field strength, and single-pixel magnetic noise floor. For example, increasing the NV layer thickness enhances magnetic sensitivity by increasing the intensity of NV fluorescence, but it can also reduce the local magnetic field strength by increasing the standoff distance. Increasing the areal density of micromagnets offers several advantages discussed above, but to resolve individual micromagnets might require a thinner NV layer. In such a case, the price for better spatial resolution could be a worse magnetic noise floor.

Alternative materials and alternative dimensions for the micromagnets may in some cases offer a more uniform distribution of magnetic moments, or better values of coercivity and remanence. All such alternatives are to be considered within the scope of the present invention.

The embodiments described above used arrays of bar-shaped micromagnets. This was advantageous for purposes of analysis and characterization. Alternative embodiments could use, e.g., disk-shaped micromagnets. A disk shape could provide greater PUF randomness, because the magnetic moment vectors would no longer be constrained along the y-axis, but instead could point in any direction in the x-y plane.

In other embodiments, the micromagnets could be fabricated with moments along the z-axis. With such an orientation, the array could be packed more densely, and the conversion of magnetization to a bit string would be simplified relative to a y-aligned micromagnet array.

Automatic optimization of magnetic sensitivity. A computer-controlled algorithm can optimize the performance of the QDM. The magnetic sensitivity (as represented by, e.g., the pixel-by-pixel noise floor) depends on the laser power and microwave power, since these affect the linewidth, the amplitude, and the photon shot noise for the experiment.

For example, A. Dreau et al., "Avoiding power broadening in optically detected magnetic resonance of single NV defects for enhanced dc magnetic field sensitivity," *Phys. Rev. B* 84, 195204 (2011), explains that for low contrast in the optically detected electron spin resonance (ESR), the shot-noise-limited magnetic field sensitivity is roughly proportional to the ratio $\Delta v/CR^{1/2}$, where $\Delta v$ is the ESR linewidth, C is the ESR contrast associated with the dip of the photoluminescent intensity, and R is the rate of detected photons.

This makes it possible, by using a computer-controlled laser and microwave source, to optimize the magnetic sensitivity by scanning the laser and microwave powers, determining the linewidth, amplitude, and intensity with a magnetometry measurement, calculating each sensitivity, and finding the global best-case sensitivity.

More specifically, the control knobs we have available for evaluating linewidth, amplitude, and intensity over a wide range of conditions are the laser power and the microwave power. By fitting and interpolating, we can find the laser power and microwave power that yield the best magnetic sensitivity.

Figure 14:
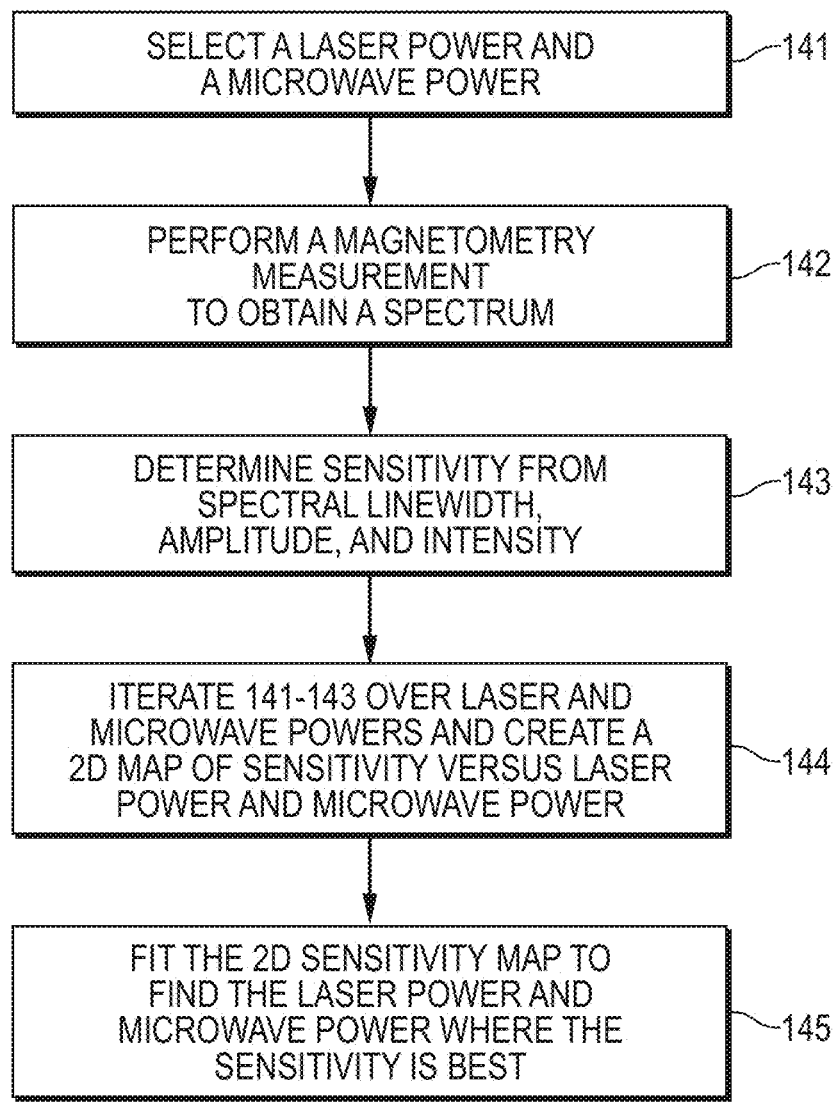
FIG. 14 is a flowchart illustrating an example algorithm suitable for optimizing the magnetic sensitivity of a QDM.

FIG. 14 is a flowchart illustrating an example algorithm suitable for optimizing the magnetic sensitivity. With reference to the steps numbered in the figure, the optimization algorithm is as follows:

ALGORITHM 1
141. Select a laser power and a microwave power.
142. Use the QDM to do a magnetometry measurement and thereby obtain a spectrum.
143. Evaluate the linewidth, amplitude, and intensity to determine the sensitivity.
144. Go to Step 141 and repeat for all relevant laser powers and microwave powers.
145. Fit the resulting 2D map of sensitivities (i.e., the plot of sensitivity as a function of laser power on one axis and microwave power on the other axis) to find the laser power and microwave power where the sensitivity is best.
END.

One benefit of the sensitivity optimizer is that with better sensitivity, less time will be spent averaging down the noise, and weaker magnetic signatures will be detectable in the samples.

Another benefit could be realized when a newly built or newly modified NV imager was first introduced. In those cases, the sensitivity optimizer could be run for assurance that the NV imager was working as well as possible.

Automatic Helmholtz coil alignment for the QDM. A computer-controlled scheme can also be used to align the external magnetic field applied to the QDM from a three-axis Helmholtz coil set.

The QDM will typically require a pair of equal and opposite bias fields of a few gauss along the N-V crystallographic axis. Generally, a separate magnetic map is measured with each of the two respective field orientations, and sums and differences are taken of the two maps. This technique of field reversal is useful for nulling spurious magnetic signals due, for example, to strain features, to inhomogeneous laser power, or to inhomogeneous microwave amplitude across the sample.

Additionally, magnetic features that persist in the bias field reversal can be classified as "ferromagnetic", whereas features that reverse together with the bias field can be classified as "paramagnetic". This classification can be useful for understanding magnetic materials that may be under examination.

It is laborious to create the equal and opposite bias fields, because it is necessary to compensate the terrestrial magnetic field, which is difficult to measure ahead of time.

To achieve equal and opposite bias magnetic fields aligned along the NV axis, a new algorithm for Helmholtz coil alignment, described here, measures the on-axis and off-axis NV resonance frequencies. Using computer-controlled current supplies, we iteratively scan a range of coil currents to find the necessary coil-current values. This automates the QDM setup, and it is generalizable to applications in which a bias magnetic field is applied along an arbitrary direction.

Figure 15:
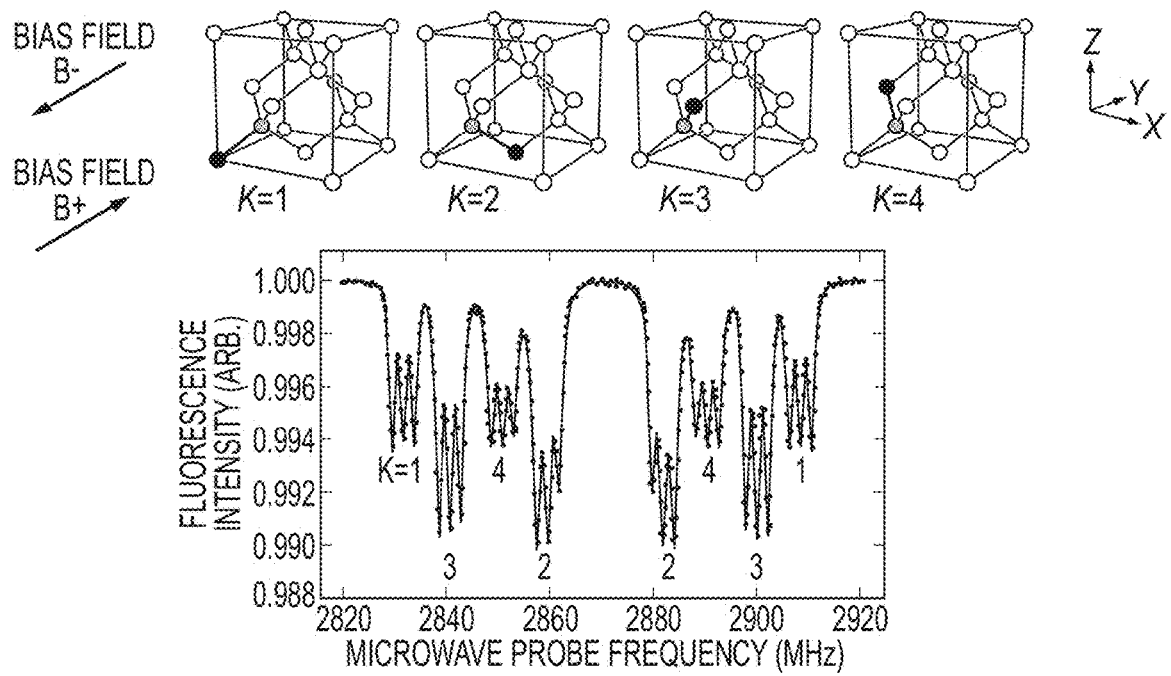
FIG. 15 provides an example NV magnetic resonance spectrum. Above the spectrum are four views of a diamond unit cell, numbered κ=1, κ=2, κ=3, κ=4. Each of the unit cells contains an NV center in a respective one of the four possible orientations. Correspondingly, each resonant triplet in the spectrum is labeled with its related NV orientation.

FIG. 15 includes an example NV magnetic resonance spectrum, first published in P. Kehayias et al., "Imaging crystal stress in diamond using ensembles of nitrogen-vacancy centers," *Physical Review B* 100, 174103 (2019). Above the spectrum are four views of a diamond unit cell, numbered $\kappa=1$, $\kappa=2$, $\kappa=3$, $\kappa=4$. Each of the unit cells contains an NV center in a respective one of the four possible orientations. Correspondingly, each resonant triplet in the spectrum is labeled with its related NV orientation.

An NV statistical ensemble has equal numbers of NV centers along each of the four crystallographic directions. In a projection magnetic microscopy (PMM) experiment, a bias magnetic field is applied along one NV axis ($\kappa=1$). But in the example spectrum shown in the figure, the bias field is along an arbitrary direction. Consequently, each respective NV orientation contributes features at a distinct resonance frequency.

For the NV orientation labeled in the figure as $\kappa=1$, the figure also includes a pair of arrows indicating the on-axis bias magnetic field vectors needed for PMM.

Figure 16:
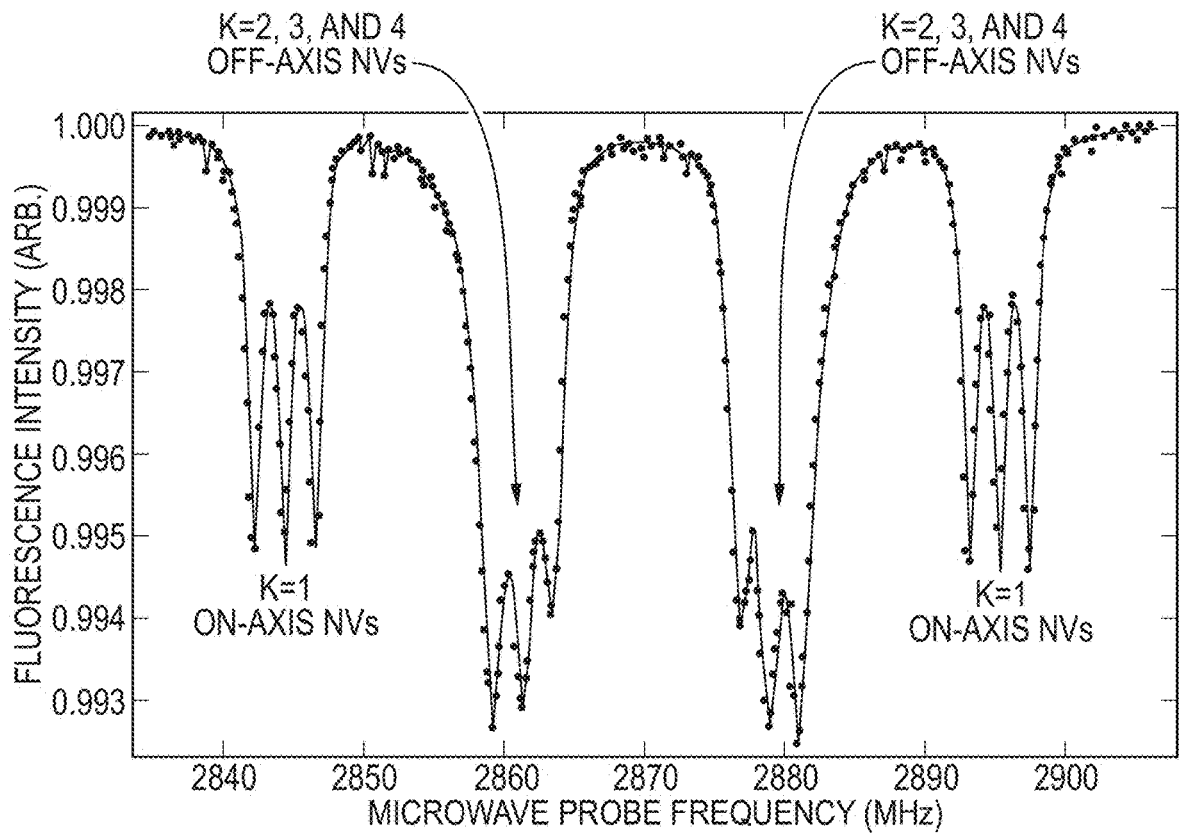
FIG. 16 is an example PMM NV magnetic resonance spectrum with the bias magnetic field directed along the κ=1 axis. When this condition obtains, the nonaligned NV resonance frequencies are all degenerate, as seen in the figure.

FIG. 16 is an example PMM NV magnetic resonance spectrum with the bias magnetic field directed along the $\kappa=1$ axis. When this condition obtains, the nonaligned NV resonance frequencies are all degenerate.

In a QDM, we use a three-axis Helmholtz coil set (for fields along $\{x,y,z\}$) to provide a bias magnetic field for the measurement. For PMM, we want a pair of bias magnetic fields that are equal and opposite and that are also aligned along the NV axis for one NV orientation. This is laborious to achieve, because the terrestrial magnetic field also contributes, and the total bias field is the sum of the coil field and the terrestrial field.

Reversing the current in each coil does not yield an equal and opposite total bias field, because of contributions from the terrestrial field and from stray fields. Thus, it is necessary to seek the set of six coil currents that satisfy the desired conditions, i.e. to seek the current values $\{I_{x+}, I_{y+}, I_{z+}\}$ for positive field $B_+$ and $\{I_{x-}, I_{y-}, I_{z-}\}$ for negative field $B_-$. Once the $B_+$ and $B_-$ resonance frequencies are equal, and once the off-axis NV resonances are degenerate, then our requirements of generating $B_+$ and $B_-$ that are equal, opposite, and well-aligned are satisfied.

Figure 17:
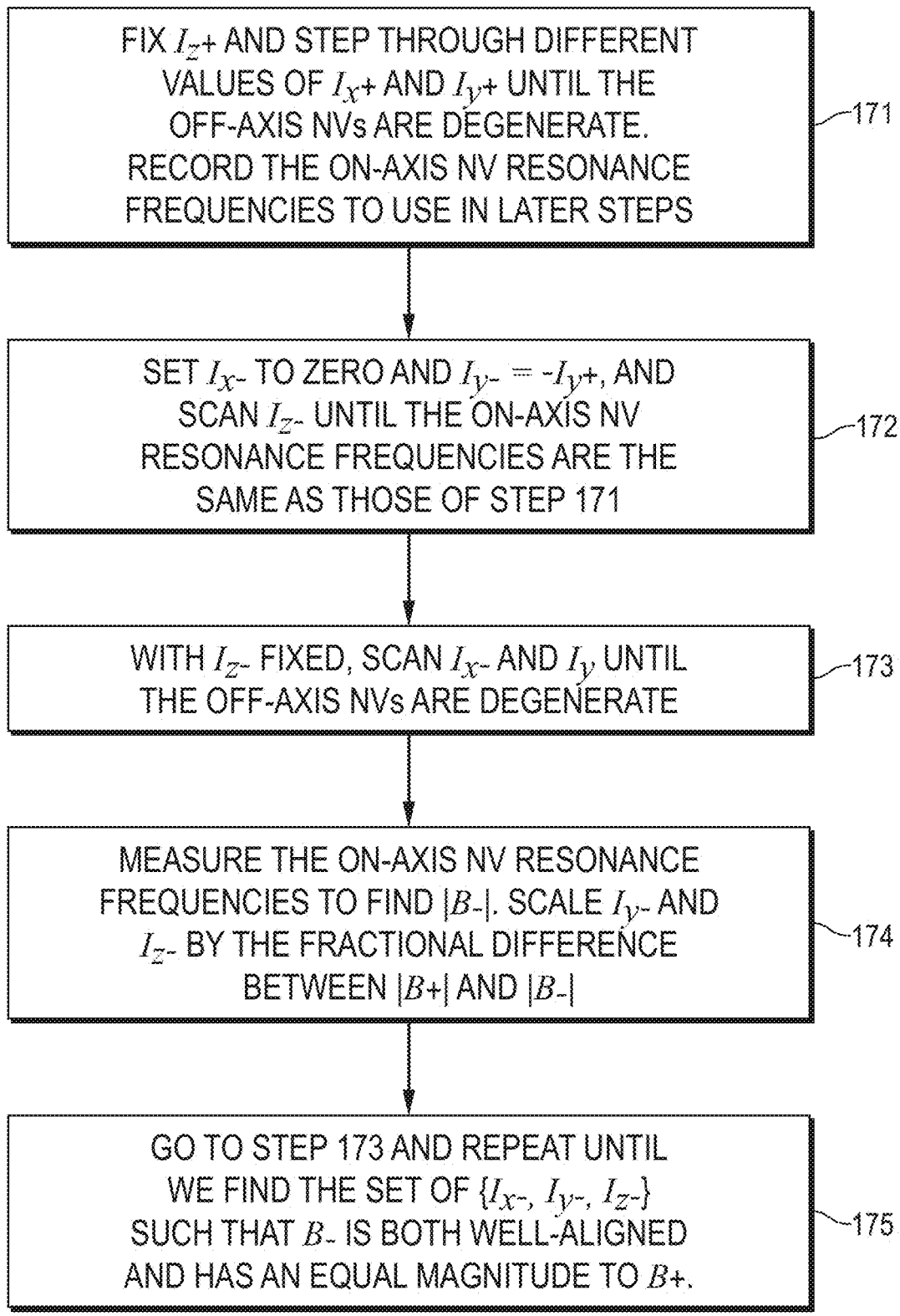
FIG. 17 is a flowchart of an example algorithm for determining the six coil currents in an arrangement for optimizing the bias magnetic field applied to a QDM.

FIG. 17 is a flowchart of an example algorithm for determining the six coil currents. The algorithm uses a computer-controlled set of three current supplies. With reference to the steps numbered in the figure, the algorithm is as follows:

ALGORITHM 2

171. Fix $I_{z+}$ and step through different values of $I_{x+}$ and $I_{y+}$ until the off-axis NV signals are degenerate. To evaluate whether the off-axis NV signals are degenerate, measure the maximum resonance depth (see FIG. 16) as a function of $I_{x+}$ and $I_{y+}$, and fit for the global maximum across all currents. This ensures that $B_+$ is well aligned. Record the on-axis NV resonance frequencies to use in later steps.

172. Set $I_{x-}$ to zero and $I_{y-} = -I_{y+}$, and scan $I_{z-}$ until the on-axis NV resonance frequencies are the same as those of the $B_+$ case.

173. With $I_{z-}$ fixed, scan $I_{x-}$ and $I_{y-}$ until the off-axis NVs are degenerate. To evaluate whether the off-axis NVs are degenerate, we use the same process as in Step 171.

174. Measure the on-axis NV resonance frequencies to find $|B_-|$. Scale $I_{y-}$ and $I_{z-}$ by the fractional difference between $|B+|$ and $|B_-|$.

175. Go to Step 173, and repeat until we find the set of $\{I_{x-}, I_{y-}, I_{z-}\}$ such that $B_-$ is both well-aligned and has an equal magnitude to $B_+$.

END

QDM instruments are becoming a standard tool for magnetic microscopy and sample characterization. Having an automated way to align the Helmholtz coil magnetic field for each QDM in the assembly line will save manufacturing time. In addition, this automated capability can be run by the end user once the QDM has left the factory, allowing the user to select different bias magnetic fields or to re-optimize the coil current values with minimal effort.

With this automated field-alignment capability, the Helmholtz coil can be stepped through bias magnetic fields of arbitrary amplitudes and spacings. This is useful for, among other things, performing magnetic hysteresis measurements and first-order reversal curve (FORC) measurements. These measurements are useful for materials characterization and for geomagnetic and biomagnetic samples, particularly because from them, the saturation magnetic field and the relative paramagnetic/ferromagnetic behavior can be extracted.

This automated technique of field alignment is generalizable to a second form of QDM operation, called vector magnetic microscopy (VMM). VMM uses $B_+$ and $B_-$ along an arbitrary axis, although the field amplitudes must still be equal and opposite. This is useful for experiments that require the full vector information over the field of view, such as current-density reconstruction from an integrated circuit. It is also useful for experiments that map the internal crystallographic stress inhomogeneity that the NVs experience. Such mapping is important for diamond growers and for QDM instrument manufacturers, among others.

We claim:

1. A method of reading a physically unclonable function (PUF) disposed on a substrate, comprising:
creating a magnetization map of the PUF from a signal output by a quantum diamond microscope (QDM), the creating step including:
 (a) imaging a pattern of nitrogen-vacancy (NV) fluorescence onto a plurality of pixels of a focal plane array;
 (b) grouping the pixels of the focal plane array into cells corresponding to respective micromagnets of the PUF; and
 (c) determining a polarity for each cell; and
converting the magnetization map to a numerical sequence.

2. The method of claim 1, wherein the magnetization map is created from measurements of magnetic dipole fields of individual micromagnets in the PUF.

3. The method of claim 2, wherein the micromagnets are arranged in an array having mutually orthogonal primary and secondary axes, and the micromagnets have random magnetic polarities that are each either parallel or antiparallel to the primary axis.

4. The method of claim 3, wherein the converting step comprises:
 (a) assigning a 0-bit or a 1-bit to each of the micromagnets according to its polarity; and
 (b) arranging the assigned bits into a binary sequence.

5. The method of claim 1, wherein determining the polarities of the cells comprises:
 (a) dividing each cell into a top half and a bottom half, each said half having a respective magnetization value; and
 (b) for each cell, subtracting one said magnetization value from the other.

6. The method of claim 1, wherein the creating step includes examining the PUF by the QDM through a visually opaque layer that covers the PUF.

7. The method of claim 1, further comprising automatically optimizing a magnetic bias field before the creating step, wherein:
 (a) the optimization uses feedback from optically detected electron spin resonance (ESR) of a nitrogen-vacancy (NV) diamond probe; and
 (b) three orthogonal components of the magnetic bias field are optimized jointly.

8. The method of claim 7, wherein:
the magnetic bias field is optimized to lie along an axis selected from four possible NV axes so that there is one selected axis and three non-selected axes;
the feedback from optically detected ESR comprises ESR spectra containing signals from NVs aligned along each of the four possible NV axes; and
in the optimization, degeneracy of the signals from NVs aligned along the non-selected axes is used as an indication that the magnetic bias field is aligned along the selected axis.

9. The method of claim 8, wherein the optimization is carried out to optimize currents in a three-axis Helmholtz coil set for producing an optimized positive bias field $B_+$, and then the optimization is further carried out to optimize currents in the said coil set for producing an optimized negative bias field $B_-$ that is equal and opposite to $B_+$.

10. The method of claim 1, further comprising automatically optimizing a power level of a microwave input to the QDM and a power level of a laser input to the QDM before the creating step, wherein:
 (a) the microwave power and the laser power are optimized jointly; and (b) the optimization uses feedback from optically detected electron spin resonance (ESR) of a nitrogen-vacancy (NV) diamond probe.

11. The method of claim 10, wherein the optimization comprises:
- measuring, with the NV diamond probe, an ESR spectrum for each of a plurality of points of a 2D space defined by microwave power and laser power;
- for each said ESR spectrum, evaluating a triplet consisting of a linewidth, an amplitude, and an intensity of the ESR spectrum;
- determining a sensitivity from each said triplet, thereby to assemble a multiplicity of sensitivity values; and
- selecting a combination of microwave power and laser power corresponding to an optimal sensitivity value from said multiplicity of sensitivity values.

12. The method of claim 1, wherein the creating step further comprises placing a probe of the QDM in proximity to a 2D array of micromagnets that at least partially constitute the PUF such that the entire array is sensed in parallel by the probe and forming, in the focal plane array of an electronic camera, a fluorescence image of the probe that is representative of a collective state of magnetization of all micromagnets of the array in parallel, and processing the image to create the magnetization map.

13. The method of claim 1, wherein
the cells have a density of at least $1 \times 10^4$ per square millimeter of PUF surface area.

14. The method of claim 13, wherein the cells have a density in the range $1\text{-}4 \times 10^4$ per square millimeter of PUF surface area.

* * * * *